United States Patent
Okayasu et al.

(10) Patent No.: US 8,369,126 B2
(45) Date of Patent: *Feb. 5, 2013

(54) MEMORY DEVICE, MANUFACTURING METHOD FOR MEMORY DEVICE AND METHOD FOR DATA WRITING

(75) Inventors: Toshiyuki Okayasu, Saitama (JP); Daisuke Watanabe, Saitama (JP)

(73) Assignee: Advantest Corporation, Tokyo (JP)

( * ) Notice: Subject to any disclaimer, the term of this patent is extended or adjusted under 35 U.S.C. 154(b) by 117 days.

This patent is subject to a terminal disclaimer.

(21) Appl. No.: 12/959,298

(22) Filed: Dec. 2, 2010

(65) Prior Publication Data

US 2011/0242895 A1    Oct. 6, 2011

Related U.S. Application Data

(63) Continuation of application No. PCT/JP2008/066350, filed on Sep. 10, 2008.

(51) Int. Cl.
G11C 13/00 (2006.01)

(52) U.S. Cl. .................... 365/118; 365/114; 257/315

(58) Field of Classification Search .................. 365/114, 365/118; 257/315
See application file for complete search history.

(56) References Cited

U.S. PATENT DOCUMENTS

| | | | |
|---|---|---|---|
| 4,190,849 A | 2/1980 | Powell | |
| 4,292,729 A | 10/1981 | Powell | |
| 4,450,537 A * | 5/1984 | Oldham | 365/217 |
| 5,245,570 A | 9/1993 | Fazio et al. | |
| 2002/0140023 A1* | 10/2002 | Ohba et al. | 257/315 |
| 2004/0262612 A1* | 12/2004 | Vidal et al. | 257/72 |
| 2005/0218405 A1* | 10/2005 | Yamazaki et al. | 257/66 |
| 2005/0250224 A1* | 11/2005 | Nozoe | 438/7 |
| 2006/0046385 A1 | 3/2006 | Fujii | |
| 2007/0222089 A1* | 9/2007 | Maruyama | 257/797 |
| 2007/0257191 A1* | 11/2007 | Kadyshevitch et al. | 250/307 |
| 2009/0261320 A1* | 10/2009 | Tano et al. | 257/40 |

FOREIGN PATENT DOCUMENTS

| | | |
|---|---|---|
| JP | 54-054586 A | 4/1979 |
| JP | 56-134776 A | 10/1981 |
| JP | 57-066675 A | 4/1982 |
| JP | 2-307276 A | 12/1990 |
| JP | H06-215587 A | 8/1994 |
| JP | 7-130890 A | 5/1995 |
| JP | 2006-066758 A | 3/2006 |

OTHER PUBLICATIONS

International Search Report (ISR) issued in PCT/JP2008/066350 (parent application) mailed in Dec. 2008 for Examiner consideration, citing U.S. Patent Nos. 2-3 and U.S. Patent Application Publication No. 1, and Foreign Patent document Nos. 2-7 listed above.
Written Opinion (PCT/ISA/237) issued in PCT/JP2008/066350 (parent application) mailed in Dec. 2008.

* cited by examiner

*Primary Examiner* — Hoai V Ho (57) ABSTRACT

A memory device to which an electron beam is irradiated to store data therein is provided. The memory device includes a plurality of floating electrodes that store data through irradiation of the electron beam thereto, a charge amount detecting section that detects data stored in each of the floating electrodes based on a charge amount accumulated in each of the floating electrode.

21 Claims, 11 Drawing Sheets

MEMORY DEVICE, MANUFACTURING METHOD FOR MEMORY DEVICE AND METHOD FOR DATA WRITING

BACKGROUND

1. Technical Field

The present invention relates to a memory device, a method of manufacturing a memory device, and a method for data writing.

2. Related Art

Memory devices using metal oxide semiconductor (MOS) have been known (for example, see Patent Document 1). One of typical examples of such memory device is a flash EPROM in which a plurality of memory cells are formed, each memory cell can store data which is written therein by a write operation, and can erase the stored data by an erase operation. The memory cell has, for example, a source region, a drain region, a control gate and an electrically-isolated floating gate. The memory cell stores data written by a user by accumulating electric charges in the floating gate. The above-stated Patent Document 1 is Japanese Patent Application Publication H06-215587.

The above mentioned memory device needs to cause an avalanche breakdown phenomenon by applying a relatively high voltage to the control gate and the drain region in order to accumulate electric charges in the floating gate and to generate a large number of hot electrons. When write/erase operations are repeated, oxide films that isolate the control gate from the source and drain regions can be easily deteriorated.

Moreover, in the above-mentioned memory device, a voltage needs to be applied to the control gate, and therefore a wiring line that couples the control gate and a voltage supplying section has to be provided in each memory cell. Furthermore, it is an advantage that the memory device can perform write/erase operations, but this could also work as a disadvantage such that it is difficult to prevent tampering with stored data.

SUMMARY

Therefore, it is an object of an aspect of the innovations herein to provide a memory device, a manufacturing method for a memory device and a method for data wiring which are capable of overcoming the above drawbacks accompanying the related art. The above and other objects can be achieved by combinations described in the claims. A first aspect of the innovations may provide a memory device to which an electron beam is irradiated to store data therein. The memory device includes a plurality of floating electrodes that store data through irradiation of the electron beam thereto, a charge amount detecting section that detects data stored in each of the floating electrodes based on a charge amount accumulated in each of the floating electrode.

A second aspect of the innovations may provide a manufacturing method for a memory device to store data written therein, which includes forming a floating electrode on a semiconductor substrate, irradiating the floating electrode with an electron beam for the floating electrode to retain charges that corresponds to data to be written.

A third aspect of the innovations may provide a data writing method to write data to be stored to a memory device which stores the data by retaining charges that corresponds to the data. The data writing method includes irradiating the floating electrode with an electron beam according to the data to be written.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
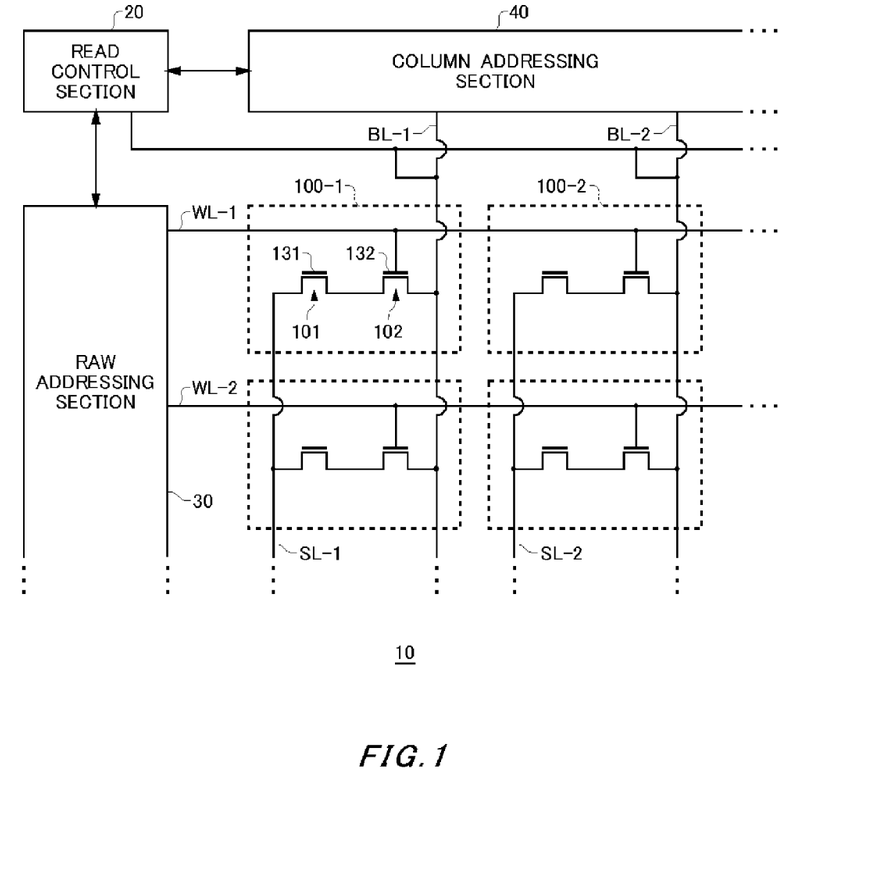
FIG. 1 shows a configuration example of a memory device 10 according to an embodiment of the invention.

FIG. 1 shows a configuration example of a memory device 10 according to an embodiment of the invention. The memory device 10 includes a read control section 20, a row addressing section 30, a column addressing section 40, and a plurality of memory cells 100 (100-1, 100-2, . . . ).

The plurality of memory cells 100 each includes a memory transistor and a read control transistor. For example, the memory cell 100-1 includes a memory transistor 101 and a read control transistor 102.

In each of the memory cells 100, a control terminal of the read control transistor is coupled to the row addressing section 30 through one of word lines WL (WL-1, WL-2, . . . ). For example, in the memory cell 100-1, a control electrode 132 of the read control transistor 102 is coupled to the row addressing section 30 through a word line WL-1.

Moreover, in each of the memory cells 100, a drain terminal of the read control transistor is coupled to the column addressing section 40 through one of bit lines BL (BL-1, BL-2, . . . ). For example, in the memory cell 100-1, a drain terminal of the read control transistor 102 is coupled to the column addressing section 40 through a bit line BL-1.

In each of the memory cells 100, a source terminal of the memory transistor is coupled to one of source lines SL (SL-1, SL-2, . . . ) which are coupled to a common reference electric potential. For example, in the memory cell 100-1, a source terminal of the memory transistor 101 is coupled to the reference potential through a source line SL-1. The plurality of the source lines SL may be coupled to a ground potential via a GND terminal of the memory device 10.

In each of the memory cells 100, a floating electrode 131 of the memory transistor is in a floating state in which it is not coupled to external wiring lines and so forth. For example, in the memory cell 100-1, the floating electrode 131 of the memory transistor 101 is electrically coupled to neither a source side nor drain side of the memory transistor 101, and to neither any of the bit lines BL nor any of the word lines WL.

In each of the memory cells 100, data is written thereto by accumulating electric charges in the floating electrode of its memory transistor, and each memory cell can store the data. In other words, the memory cells 100 utilize a difference in the electric potential between the source and the drain caused by electric charges accumulated or not accumulated in the floating electrodes of the memory transistors, and can retain data in a nonvolatile manner.

Data writing to each of the memory cells 100 is performed by irradiating the floating electrode of its memory transistor with an electron beam. In other words, the floating electrode of the memory transistor of the memory cell 100 to which data is to be written is irradiated with an electron beam by using, for example, an electron irradiating apparatus or the like, and then electric charges are accumulated in the floating electrode of the memory transistor. In this way, data is stored in the memory cell 100.

Here, the irradiation of the electron beam to the memory transistor may be simultaneously performed onto more than one memory cell 100 into which data is to be written. Alternatively, the irradiation of the electron beam may be performed individually on each memory transistor of the memory cell while adjusting an irradiance level of the electron beam for each memory transistor. The memory transistor may serve as a charge amount detecting section which detects data that is stored in the floating electrode based on the charge amount accumulated in the floating electrode.

The memory transistor may detect binary data stored in the floating electrode, by using the floating electrode as a gate terminal, based on ON-state and OFF-state of the transistor which depends on the charge amount accumulated in the floating electrode. Alternatively, the memory transistor may detect multi-valued data stored in the floating electrode through current of which magnitude corresponds to the charge amount accumulated in the floating electrode.

The floating electrode of the memory transistor in each memory cell 100 can accumulate a charge amount corresponding to an irradiance level of the electron beam onto the memory transistor. Therefore, each memory cell 100 can store multi-valued data by irradiating the memory transistor with the electron beam at an irradiance level that corresponds to a desired write data. Here, the irradiance level of the electron beam may be determined based on intensity and irradiation time of the electron beam.

The data written in the memory transistor of the memory cell 100 can be read out by operating the read control transistor in the memory cell 100. For example, when data that have been written to the memory transistor 101 in the memory cell 100-1 is read, the read control section 20 sends, to the row addressing section 30 and the column addressing section 40, a control signal that indicates a prescribed voltage is supplied to the read control transistor 102 in the memory cell 100-1.

The row addressing section 30 and the column addressing section 40 apply prescribed voltages to the control electrode 132 and the drain terminal of the read control transistor 102 respectively in response to the control signal from the read control section 20, and thereby the read control transistor 102 is turned to a conducting state. In this way, current of which magnitude corresponds to a value of the data written into the memory transistor 101, in other words, current of which magnitude corresponds to the charge amount accumulated in the floating electrode 131 of the memory transistor 101, flows in the memory cell 100-1.

The read control section 20 detects this current running through the memory cell 100-1 when the read control transistor 102 is in the conducting state. More specifically, the read control section 20 may include a current detection means such as a sense amplifier, and a reference current value (a sense current value) which is used as a comparison benchmark with respect to the detected current from the memory cell 100 is set in advance to the current detection means.

For example, when a magnitude of the current detected by the current detection means from the memory cell 100-1 exceeds the reference current value, the read control section 20 determines that, in transistor 101 in the memory cell 100-1, a data value written in the memory is logical value "H". When the magnitude of the current detected from the memory cell 100-1 does not exceed the reference current value, the read control section 20 determines that logical value "L" is written in the memory transistor 101 in the memory cell 100-1.

The read control section 20 may set in advance, to the current detection means, different reference current values each of which is associated with different one of the multi-valued data values. In this way, the read control section can determine which one of the multi-valued data values is written in the memory cell 100-1 by comparing the magnitude of the current from the memory cell 100-1 to the reference current value.

Alternatively to the configuration of the embodiment, the current detection means may be provided separately from the read control section 20. In this case, the current detection means may be electrically coupled to the plurality of bit lines BL and detect current running through the memory cell 100 from which write data is to be read out. The above-stated current detection means is one example of the charge amount detecting section that detects a charge amount accumulated in the floating electrode in the memory cell 100, and not limited to the above-described sense amplifier.

The data that has been written to the memory transistor in the memory cell 100 can be erased by irradiating the floating electrode of the memory transistor with ultraviolet. In other words, the floating electrode of the memory transistor in the memory cell 100 that holds data to be erased is irradiated with ultraviolet by using, for example, an ultraviolet irradiation apparatus or the like, thereby the electric charges accumulated in the floating electrode are discharged, and the data stored in the memory cell 100 can be erased.

The above-described erase operation may be performed simultaneously onto the plurality of the memory cells 100 or the whole of the memory device 10. Alternatively, an area exposed to the ultraviolet irradiation may be limited to specific memory cells 100 by using an ultraviolet laser or an ultraviolet lamp that can narrow down a spot diameter of the beam, and using a mask or the like.

When, in the memory cell 100, data is newly written to the memory transistor in which data has been already written, the memory transistor is first irradiated with ultraviolet to release charges accumulated in the floating electrode, the memory transistor may be then irradiated with the electron beam at a irradiance level that corresponds to the new data which is to be written, so as to accumulate electric charges of which amount corresponds to the new write data in the floating electrode.

Alternatively, when data of a charge amount which is larger than a charge amount of the electric charges that have been already accumulated in the floating electrode of the memory transistor is newly written, the data value corresponding to the charge amount that has been already accumulated in the floating electrode of the memory transistor is first determined by detecting a current value therein by using the current detection means. The memory transistor is then irradiated with the electron beam at an irradiance level that corresponds to a charge amount difference between the data value stored in the memory transistor and a value of the new write data.

Alternatively, when data of a charge amount which is smaller than the charge amount of the electric charges that have been already accumulated in the floating electrode of the memory transistor is newly written, the memory transistor is first irradiated with ultraviolet to release the charges accumulated in the floating electrode, the memory transistor may be then irradiated with an electron beam at an irradiance level that corresponds to the new write data.

As described above, the memory device 10 can write and store data in the non-volatile manner by irradiating a desired memory cell 100 into which the data is written with electron beam. As a result, in each memory cell 100, it is not necessary to provide wiring for storing electric charges in the floating electrode of the memory transistor. Moreover, the memory device 10 can easily read and erase the data written in the memory cells 100 when needed. Furthermore, by controlling the irradiance level of the electron beam, the memory device 10 can write data that corresponds to the irradiated amount of the electron beam onto the memory transistor in the memory cell 100.

Examples of the structure of the memory cell 100-1 in the memory device 10 will be now described in details with reference to drawings.

Figure 2:
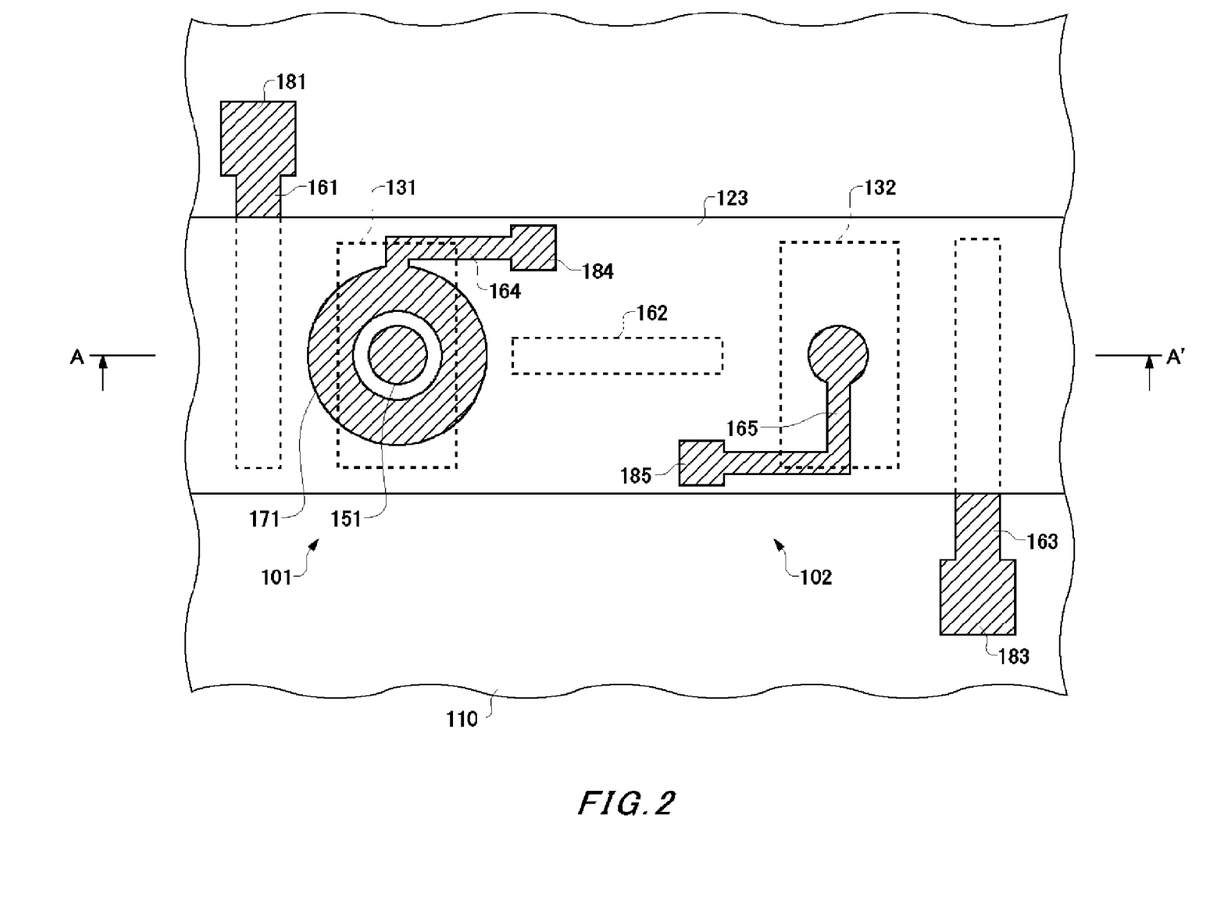
FIG. 2 is a top view of a memory cell 100-1.
Figure 3:
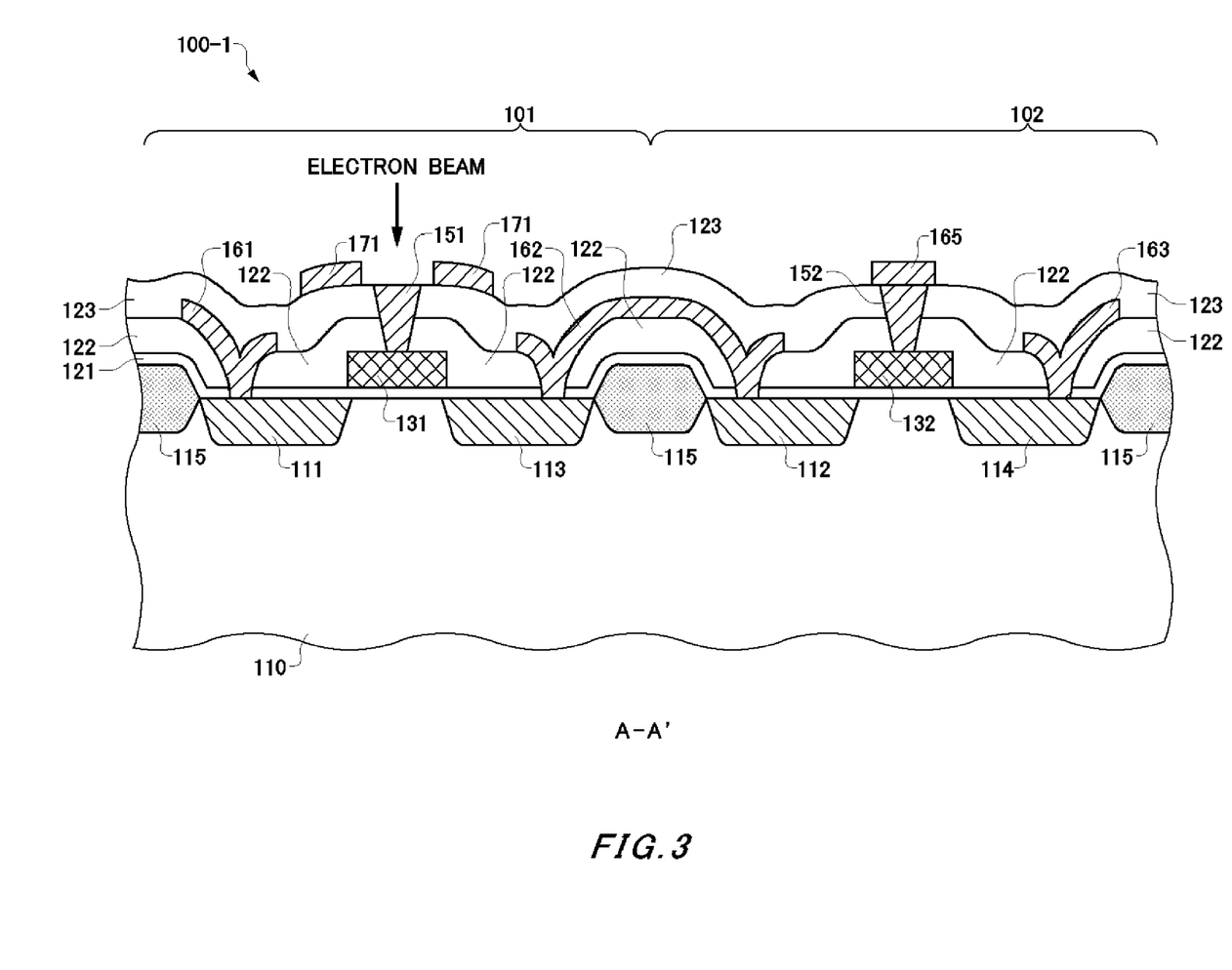
FIG. 3 is a sectional view of the memory cell along the line A-A' in FIG. 2.

FIG. 2 is a top view of the memory cell 100-1. FIG. 3 is a sectional view of the memory cell along the line A-A' in FIG. 2. The memory cell 100-1 includes a semiconductor substrate 110, and the memory transistor 101 and the read control transistor 102 which are provided on the semiconductor substrate 110. The memory transistor 101 and the read control transistor 102 may be formed on the semiconductor substrate 110 by, for example, a prescribed semiconductor process, and has a P-type or N-type channel property. A case in which the memory transistor 101 and the control transistor 102 both have the N-type channel property is hereunder described.

The memory transistor 101 is provided on the semiconductor substrate 110 in a region divided by isolating regions 115 which are made of an insulating material such as silicon dioxide. The memory transistor 101 includes a source region 111, a drain region 113, a floating electrode 131, a via 151 and a guard ring 171.

The source region 111 and the drain region 113 are provided separately each other on a surface portion of the semiconductor substrate 110. The source region 111 and the drain region 113 may be formed by implanting phosphorus ions into a prescribed depth from an upper face of the semiconductor substrate 110 which is made of mono-crystalline silicon. When the memory transistor 101 has the N-type channel property, the semiconductor substrate 110 is a P-type substrate, and the source region 111 and the drain region 113 may be an N-type region.

The floating electrode 131 is disposed on the semiconductor substrate 110 so as to oppose the source region 111 and the drain region 113 with an insulating film 121 made of an insulating material such as silicon dioxide interposed therebetween. In this example, the floating electrode 131 may be disposed between the source region 111 and the drain region 113 in a planar direction parallel to the semiconductor substrate 110.

The via 151 is made of an electrically conductive material, and provided such that it penetrates to the floating electrode 131 from a surface of the insulating film 123. In this example, an insulating film 122 and an insulating film 123 which are deposited films of insulating materials are formed to cover the floating electrode 131, the via 151 penetrates the insulating films 122, 123, and one end of the via 151 is exposed from a surface of the insulating film 123.

A pattern wiring line 161 and a pattern wiring line 162 are disposed between the insulating film 122 and the insulating film 123. The pattern wiring line 161 electrically couples a source terminal 181 and the source region 111 that are provided on the semiconductor substrate 110. The pattern wiring line 162 electrically couples a source region 112 and the drain region 113 of the hereunder described read control transistor 102. The source terminal 181 is coupled to the source line SL-1 of the memory device 10 shown in FIG. 1.

The guard ring 171 is made of, for example, an electrically conductive metal material, and disposed so as to surround the via 151 on the surface of the insulating film 123. In this example, the guard ring 171 is electrically coupled, through the pattern wiring line 164, to a guard terminal 184 which is coupled to a reference potential. A shape of the guard ring 171 is not limited to an annular shape centered at the via 151 like the one shown in the example, but it may be a rectangle shape or a polygonal shape. The guard terminal 184 may be coupled to a ground potential through a GND terminal of the memory device 10.

The read control transistor 102 is provided in a region divided by the isolating regions 115, and includes the source region 112, a drain region 114, a control electrode 132, a via 152 and a pattern wiring line 165. The read control transistor 102 may be disposed adjacent to the memory transistor 101 with the isolating region 115 interposed therebetween like this example, and alternatively it may be disposed in other region on the semiconductor substrate 110 depending on arrangements of the memory cells 100 in the memory device 10.

The source region 112 and the drain region 114 are provided separately each other on the surface portion of the semiconductor substrate 110. In the same manner as the source region 111 and the drain region 113, the source region 112 and the drain region 114 may be formed by implanting phosphorus ions to a prescribed depth from the upper face of the semiconductor substrate 110.

The control electrode 132 is disposed so as to oppose the source region 112 and the drain region 114 with the insulating film 121 interposed therebetween. In this example, the control electrode 132 may be disposed between the source region 112 and the drain region 114 in a planar direction parallel to the semiconductor substrate 110.

The via 152 is made of an electrically conductive material, in the same manner as the above-described via 151, and provided so as to penetrate to the control electrode 132 from the surface of the insulating film 123. A pattern wiring line 163 is provided between the insulating film 122 and the insulating film 123, and electrically couples a drain terminal 183 and the drain region 114 provided on the semiconductor substrate 110. The pattern wiring line 165 is provided on the insulating film 123, and electrically couples the control terminal 185 to the via 152. The control terminal 185 is coupled to the word line WL-1 of the memory device 10 shown in FIG.

1. More specifically, the control electrode 132 is electrically coupled to the word line WL-1 through the via 152, the pattern wiring line 165 and the control terminal 185.

In the memory cell 100-1 described with reference to FIG. 2 and FIG. 3, the via 151 of the memory transistor 101 is irradiated with the electron beam at an irradiance level which corresponds to write data, and electric charges of which amount corresponds to the irradiated amount are accumulated in the floating electrode 131.

Here, when the read control transistor 102 is turned on by applying prescribed voltages respectively to the control electrode 132 and the drain region 114 of the read control transistor 102, a voltage at a prescribed level is supplied to the drain region 113 of the memory transistor 101 through the read control transistor 102. Current of which magnitude corresponds to the charge amount accumulated in the floating electrode 131, runs between the source region 111 and the drain region 113 of the memory transistor 101.

In this example, the memory transistor 101 has the N-type channel property so that the magnitude of the current running between the source region 111 and the drain region 113 of the memory transistor 101 becomes maximum when no electric charges accumulated in the floating electrode 131, and becomes smaller as more electric charges are accumulated in the floating electrode 131. A value of the data stored in the memory transistor 101 can be read by detecting this current with the above-mentioned current detection means.

In this way, the memory device 10 can write and store data by irradiating the memory cells 100 with the electron beam. Accordingly, it is not necessary to provide wiring to accumulate electric charges in the floating electrodes of the memory transistors in the memory cells 100. Once data has been written in the memory cell 100, the value of the written data cannot be changed without irradiating the memory cell 100 again with the electron beam. Therefore, it is possible to prevent the data written in the memory device 10 from being easily tampered.

In this example, when the via 151 is irradiated with the electron beam, a portion of electrons included in the irradiated electron beam can be scattered around the via 151. However, since the conductive guard ring 171 is provided around the via 151 as described above, the scattered electrons are trapped by the guard ring 171. Accordingly, in the memory transistor 101, the scattered electrons are not drawn into, for example, the insulating film 123, and thereby it is possible to prevent electric charges form being accumulated in the insulating film 123.

FIGS. 4 through 8 illustrate sectional views of the memory cell 100-1 showing steps in a manufacturing process of the memory cell 100-1. The memory device 10 according to this embodiment is manufactured by, for example, fabricating the read control section 20, the row addressing section 30, the column addressing section 40 and the plurality of memory cells 100 on the polysilicon semiconductor substrate 110 through semiconductor processes. A manufacturing method for the memory cell 100-1 is hereunder described as a part of the manufacturing process of the memory device.

Figure 4:
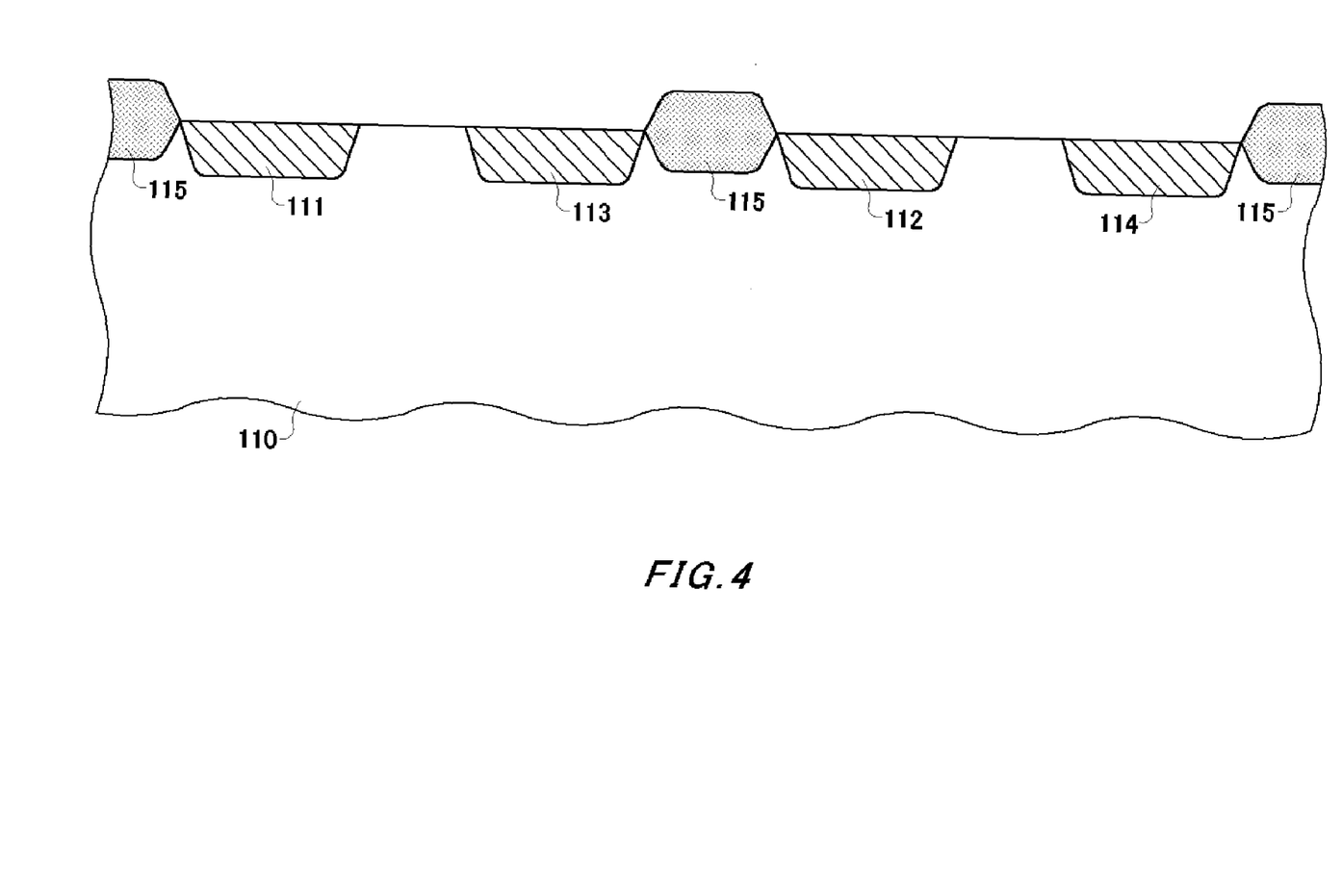
FIG. 4 illustrates a sectional view of the memory cell 100-1 showing a manufacturing process of the memory cell 100-1.

Referring to FIG. 4, a portion of the semiconductor substrate 110 is thermally oxidized to form the plurality of isolating regions 115. Subsequently, the source region 111 and the drain region 113 are formed in one of regions divided by the isolating regions 115 in the semiconductor substrate 110. Further, the source region 112 and the drain region 114 are formed in a region next to the region in which the above-mentioned source region and the drain region are formed.

Here, when the memory transistor 101 and the read control transistor 102 have the N-type channel property, the source regions 111, 112 and the drain regions 113, 114 are formed by implanting n-type ions (for example, phosphorus ions) to a prescribed depth from the upper face of the semiconductor substrate 110. When the memory transistor 101 and the read control transistor 102 have the P-type channel property, the source regions 111, 112 and the drain regions 113, 114 are formed by implanting p-type ions (for example, boron ions) to a prescribed depth from the upper face of the semiconductor substrate 110.

Figure 5:
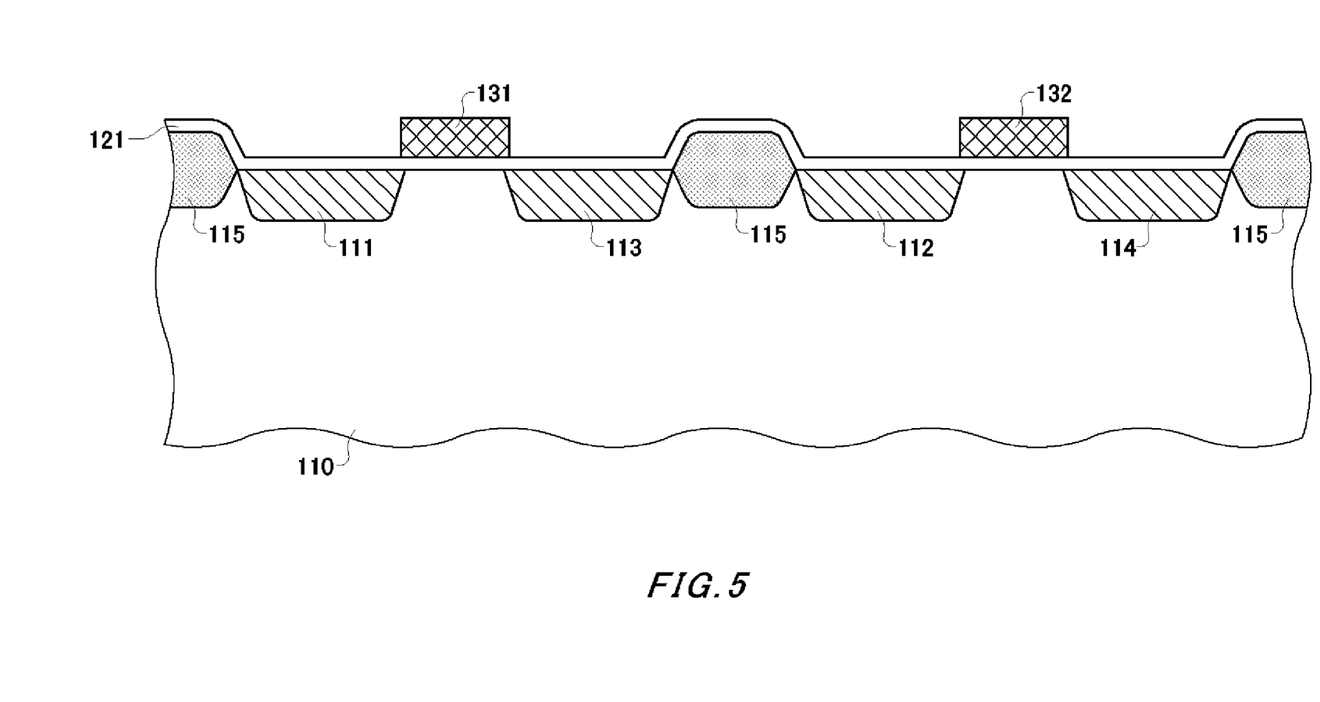
FIG. 5 illustrates a sectional view of the memory cell 100-1 showing the manufacturing process of the memory cell 100-1.

Referring to FIG. 5, the insulating film 121 is formed on the surface of the semiconductor substrate 110. The floating electrode 131 and the control electrode 132 are formed on the insulating film 121. More specifically, the insulating film 121 made of silicon dioxide may be fabricated by thermal-oxidizing a surface layer of the monocrystalline semiconductor substrate 110, and the floating electrode 131 and the control electrode 132 may be formed by depositing polysilicon.

Figure 6:
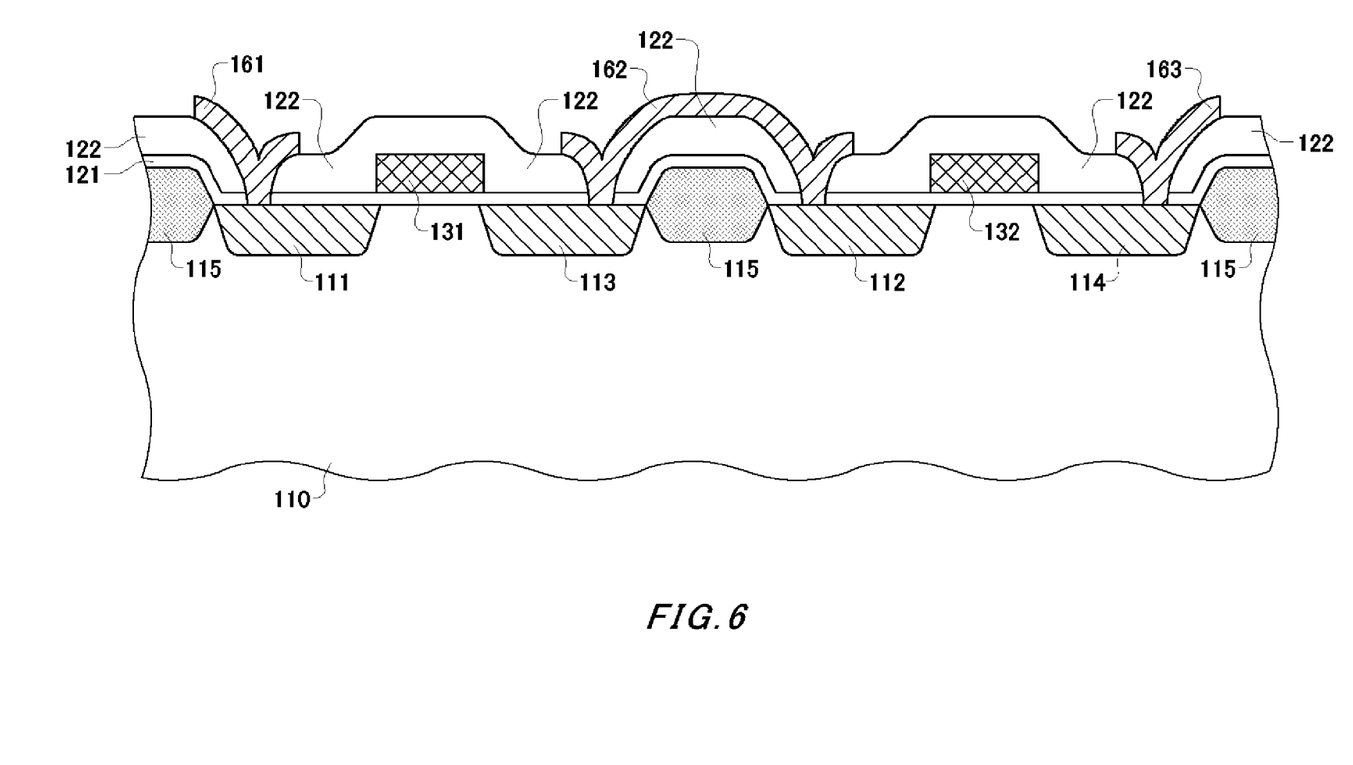
FIG. 6 illustrates a sectional view of the memory cell 100-1 showing the manufacturing process of the memory cell 100-1.

Referring to FIG. 6, the insulating film 122 is subsequently formed on the insulating film 121 so as to cover outer surfaces of the insulating film 121, the floating electrode 131 and the control electrode 132. After removing potions of the insulating film 121 and the insulating film 122, the pattern wiring lines 161, 162, 163 are formed. More specifically, an insulating metal oxide is deposited first on the insulating film 121, for example, portions of the insulating film 121 and the insulating film 122 over the source regions 111, 112 and the drain regions 113, 114 are then removed by pattern-etching. An electrically conductive metal material such as aluminum may be subsequently vacuum-deposited in regions centering on the etched portions to form the pattern wiring lines 161, 162, 163. In this example, by forming the pattern wiring line 162, the drain region 113 of the memory transistor 101 is electrically coupled to the source region 112 of the read control transistor 102.

Figure 7:
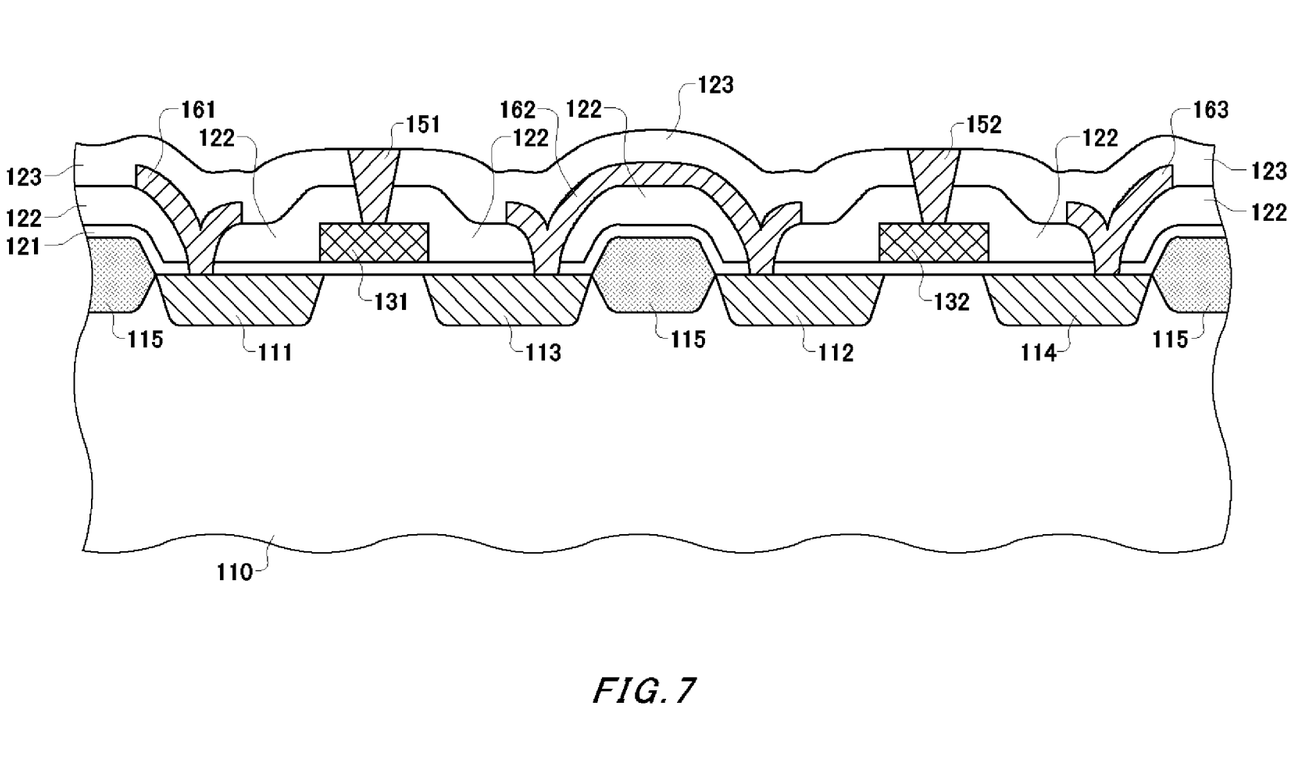
FIG. 7 illustrates a sectional view of the memory cell 100-1 showing the manufacturing process of the memory cell 100-1.

Referring to FIG. 7, the insulating film 123 is further formed over the insulating film 122. Portions of the insulating film 122 and the insulating film 123 that cover the floating electrode 131 and the control electrode 132 are then pattern-etched to from through-holes, and conductive metal is deposited inside the through-holes to form the via 151 and the via 152. The insulating film 123 may be formed in substantially the same manner as the insulating film 122.

Figure 8:
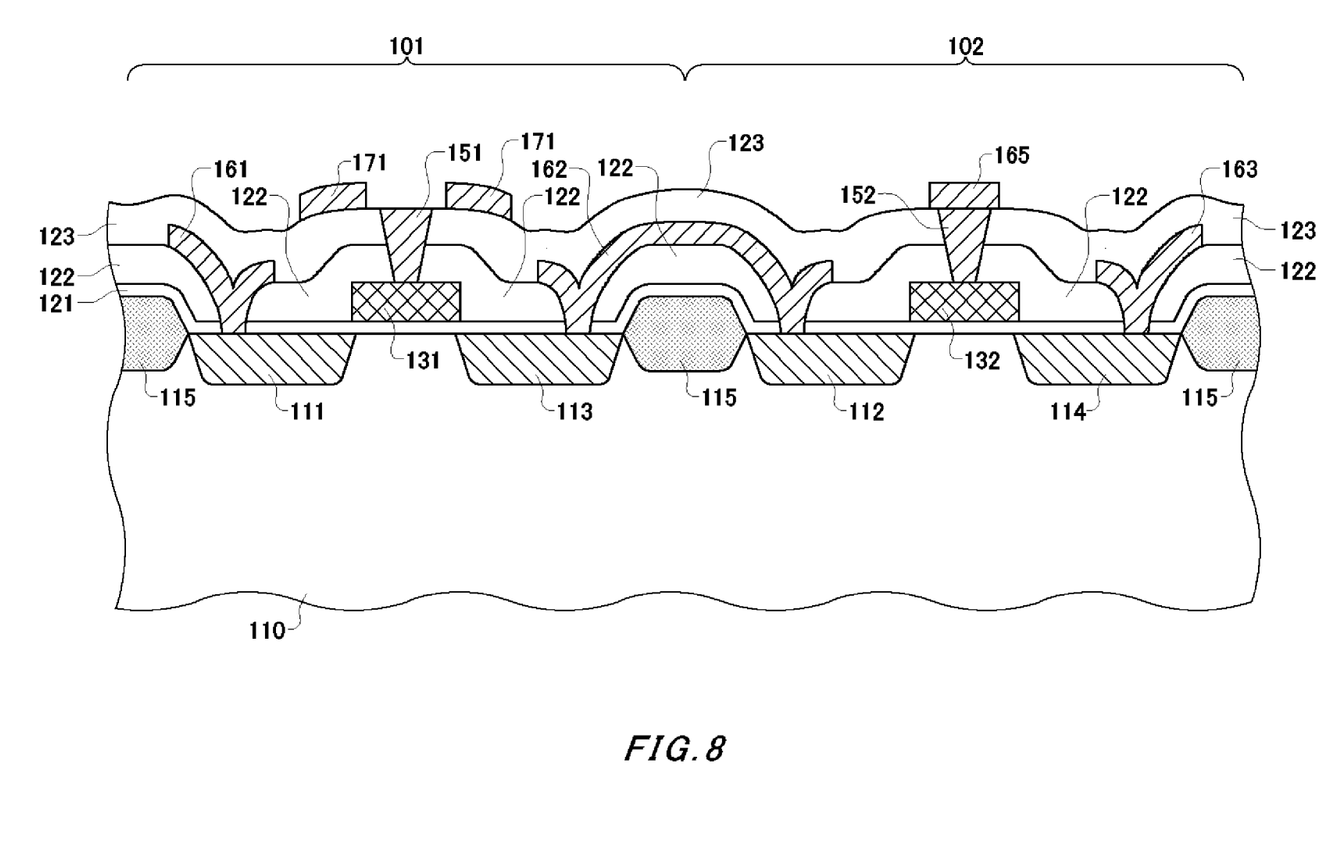
FIG. 8 illustrates a sectional view of the memory cell 100-1 showing the manufacturing process of the memory cell 100-1.

Referring to FIG. 8, the guard ring 171 is subsequently formed around the via 151 on the insulating film 123. The pattern wiring line 165 is the formed on the insulating film 123 so as to cover the via 152. Although not shown in the drawing, the source terminal 181, the drain terminal 183 and the control terminal 185 are also formed in the step. The guard ring 171, the pattern wiring line 165 and the above-mentioned terminals may be formed by vacuum-deposing conductive metal material such as aluminum.

Through the above-described steps, the memory cell 100-1 can be formed on the semiconductor substrate 110. Other memory cells 100 in the memory device 10 can also be formed in substantially the same process as the above-described manufacturing method of the memory cell 100-1. When certain data is written in advance to the memory device 10, the via 151 of the memory transistor 101 in the memory cell 100 to which the data to be written may be irradiated with an electron beam at a predetermined irradiance level after the above-described process. In this way, predetermined data may be written in advance at the time of fabrication of the memory device 10.

Other configuration examples of the memory cell 100 in the memory device 10 will be now described by taking the memory cell 100-1 as an example, and any of the hereunder-described configuration examples can be applied to the other memory cells 100 in addition to the memory cell 100-1.

Figure 9:
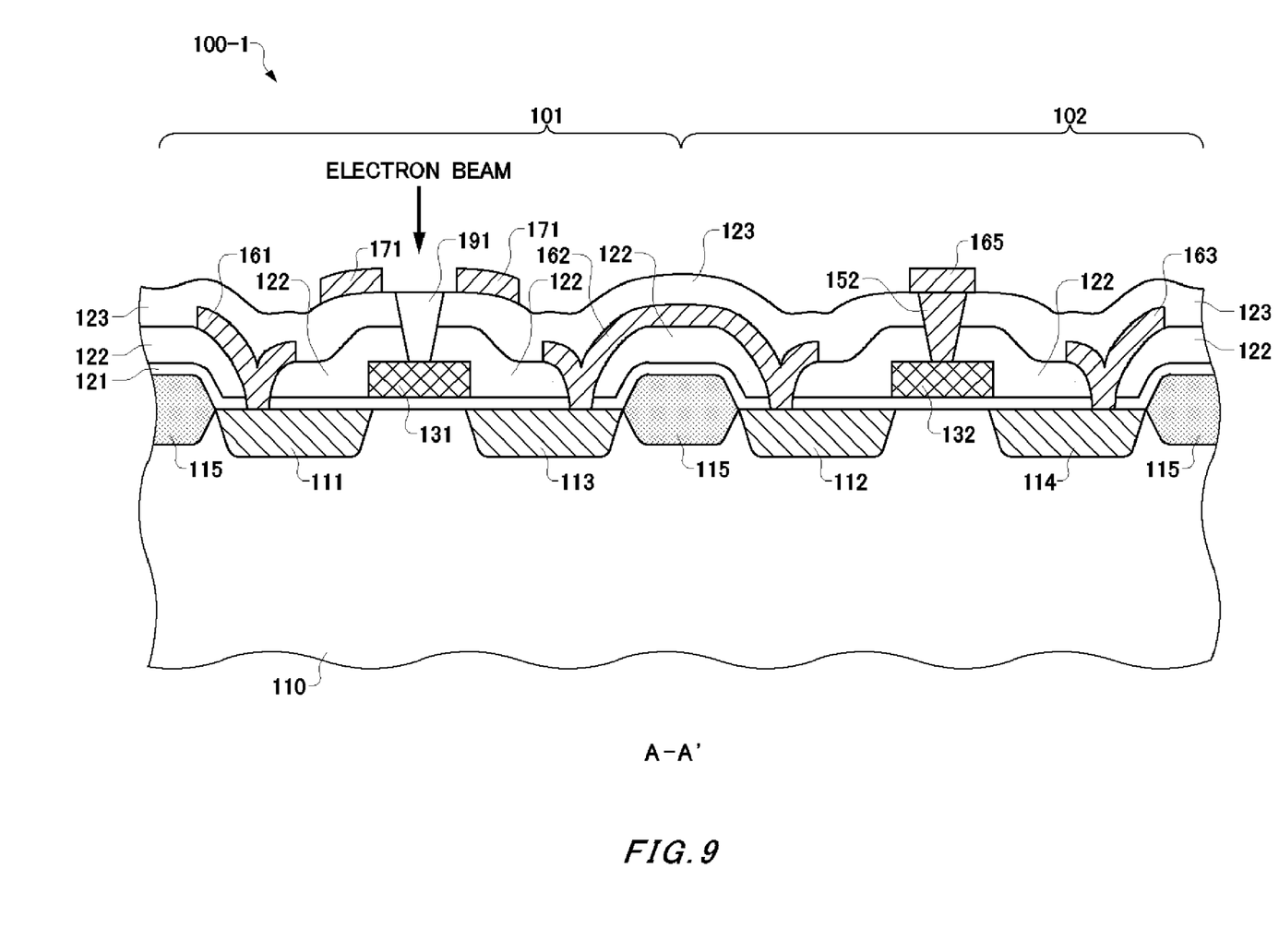
FIG. 9 is a sectional view of the memory cell 100-1 showing another configuration example of the memory cell.

FIG. 9 is a sectional view of the memory cell 100-1 showing another configuration example of the memory cell. Referring to FIG. 9, the memory cell 100-1 in this example has a through-hole 191 which is formed by, for example, pattern-etching, instead of the via 151 in the memory cell 100-1 described above with reference to FIG. 3. Other structures are the same as those in the memory cell 100-1 described above, so that the descriptions concerning these structures will be hereunder omitted. Since the memory transistor 101 of the memory cell 100-1 has the through-hole 191 in this example, the electron beam can be directly irradiated to the floating electrode 131.

In the configurations of the memory cell 100-1 described above with reference to FIG. 3 and FIG. 9, the via 151 or the through-hole 191 is provided over the floating electrode 131, and thereby electric charges supplied by the electron beam irradiation can be securely injected into the floating electrode 131. However, it is not necessarily required to form the via 151 and the through-hole 191 that couple the floating electrode 131 to the surface of the insulating film 123 if thicknesses of the insulating film 122 and the insulating film 123 over the floating electrode 131 are, for example, small enough for the electron beam to penetrate the insulating film 122 and the insulating film 123 and to reach the floating electrode 131, and thereby electric charges can be accumulated in the floating electrode 131 by the electron beam irradiation.

Figure 10:
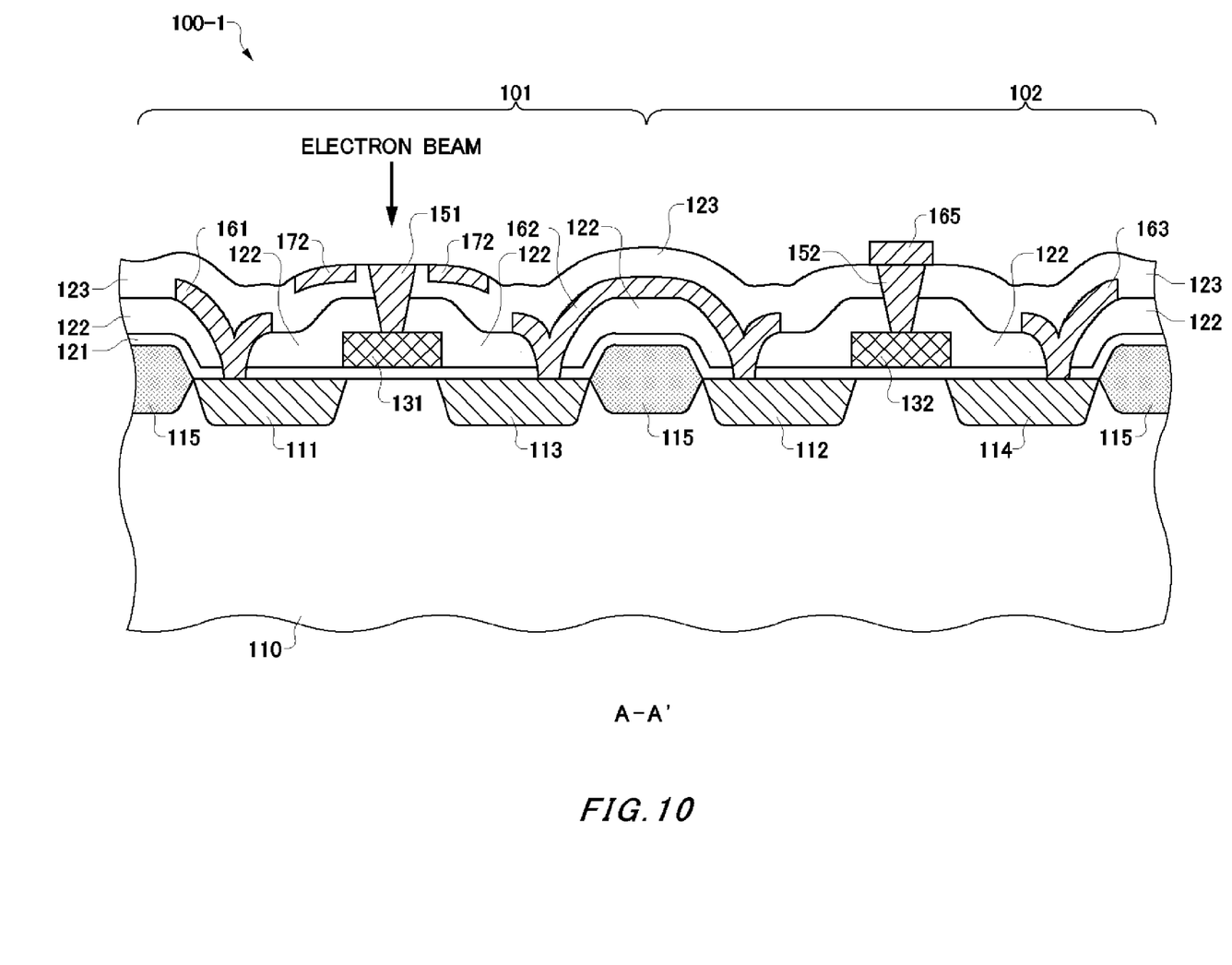
FIG. 10 is a sectional view of the memory cell 100-1 showing another configuration example of the memory cell.

FIG. 10 is a sectional view of the memory cell 100-1 showing another configuration example of the memory cell. Referring to FIG. 10, the memory cell 100-1 in this example has a guard ring 172 in stead of the guard ring 171 of the memory cell 100-1 described above with reference to FIG. 3. Other structures than the guard ring 172 are same as those of the above-described memory cell 100-1 so that these descriptions will be hereunder omitted.

The guard ring 172 is formed by, for example, pattern-etching the insulating film 123 in a peripheral region of the via 151, and subsequently depositing a conductive material in an etched groove formed by the etching. Although only the sectional view of the guard ring 172 is illustrated in FIG. 10, a shape of the guard ring 172 provided in the peripheral region of the via 151 may be same as that of the above-described guard ring 171. When the memory transistor 101 of the memory cell 100-1 has the guard ring 172 in this example, it is possible to prevent the guard ring 172 from being detached by external contact against the memory device 10 or the like.

Figure 11:
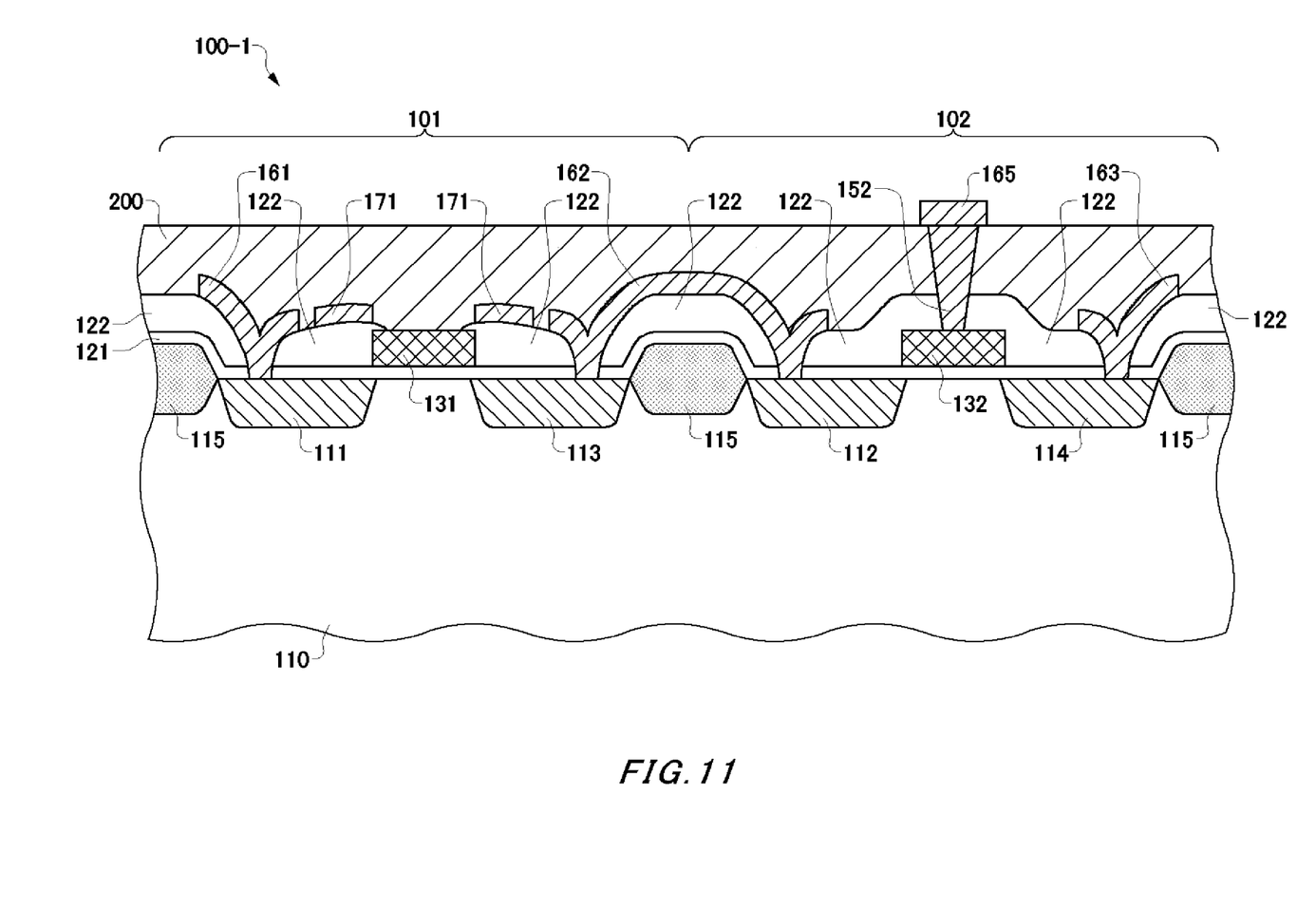
FIG. 11 is a sectional view of the memory cell 100-1 showing another configuration example of the memory cell.

FIG. 11 is a sectional view of the memory cell 100-1 illustrating another configuration example. In the memory cell 100-1 of this example, the insulating film 122 is provided in such a way that it covers the surface of the floating electrode 131 but exposes at least a part of the surface of the floating electrode 131. The guard ring 171 is provided on the insulating film 122 around the floating electrode 131. On the insulating film 122, a package section 200 is further formed as the top layer of the semiconductor substrate 110, so as to cover the pattern wiring lines 161, 162, 163 and the guard ring 171 provided on the insulating film 122 and to cover the upper surface of the floating electrode 131.

The package section 200 may be provided to encompass the memory device 10 after the memory transistors of the memory cells 100 in which pieces of data are to be written are irradiated with the electron beam to accumulate electric charges in the floating electrodes of the memory transistors in the memory device 10. An insulating resin material may be preferably used for the package section 200. By writing data to the memory cells 100 in the memory device 10 before packaging the memory device 10 with the package section 200, like the example described above, it is possible to prevent the data written in the memory device 10 from being easily tampered.

The memory cell 100 of this example may be used as, for example, a storage element to store identification information of the memory device 10. In this way, in addition to the advantage of tampering prevention of the identification information, it is possible to know a lot number, a manufactured data and so forth of the electric circuit by reading the identification information of the memory device 10 particularly when it is returned from a customer due to a failure or the like after it had been shipped.

Moreover, the memory device 10 shown in FIG. 11 may further include a via that couples the upper face of the package section 200 and the floating electrode 131 of the memory transistor 101. In this case, data can be written to the floating electrode 131 of the memory transistor 101 by irradiating the via with the electron beam after the memory device 10 is packaged with the package section 200. Even in this case, it is possible to prevent the written data from being tampered by fixing the package covering the exterior of the package section 200 with adhesive or the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A memory device to which an electron beam is irradiated to store data therein, comprising:
    a floating electrode that stores data through irradiation of the electron beam thereto;
    a charge amount detecting section that detects data stored in the floating electrode based on a charge amount accumulated in the floating electrode;
    an insulating film that covers a surface of the floating electrode; and
    a guard ring that is provided on a surface of the insulating film so as to surround a via or a through-hole that penetrates to the floating electrode from the surface of the insulating film, the guard ring being coupled to a reference potential.

2. The memory device according to claim 1, further comprising:
    a via that is made of an electrically conductive material and that penetrates to the floating electrode from the surface of the insulating film.

3. The memory device according to claim 2, wherein the guard ring is provided so as to surround the via.

4. The memory device according to claim 1, wherein the insulating film has a through-hole which penetrates to the floating electrode from the surface of the insulating film, and the guard ring is provided so as to surround the through-hole.

5. The memory device according to claim 1, wherein the insulating film covers the surface of the floating electrode such that at least a part of the surface of the floating electrode is exposed from the insulating film.

6. The memory device according to claim 1, wherein the memory device is fabricated by depositing prescribed materials to form layers on a semiconductor substrate, and the insulating film is disposed in a top layer on the semiconductor substrate.

7. A manufacturing method for a memory device to store data written through an electron beam irradiation, comprising:
   forming a floating electrode on a semiconductor substrate;
   forming an insulating film that covers a surface of the floating electrode;
   forming a guard ring on a surface of the insulating film so as to surround a via or a through-hole that penetrates to the floating electrode from the surface of the insulating film, the guard ring being coupled to a reference potential; and
   irradiating the floating electrode with an electron beam for the floating electrode to retain charges that corresponds to data to be written.

8. The manufacturing method according to claim 7, wherein
   said irradiating includes adjusting the electron beam according to a value of the data to be written to the floating electrode.

9. The manufacturing method according to claim 7, wherein
   a time duration in which the floating electrode is irradiated with the electron beam is adjusted according to a value of the data to be written to the floating electrode.

10. The manufacturing method according to claim 7, wherein
    an amount of current of the electron beam is adjusted according to a value of the data to be written to the floating electrode.

11. The manufacturing method according to claim 7, wherein the insulating film over the surface of the floating electrode is irradiated with the electron beam to inject electrons into the floating electrode.

12. The manufacturing method according to claim 7, wherein
    the insulating film partially covers the surface of the floating electrode, and
    a part of the surface of the floating electrode that is not covered with the insulating film is irradiated with the electron beam to inject electrons into the floating electrode.

13. The manufacturing method according to claim 7, further comprising:
    forming a via that is made of an electrically conductive material and that penetrates to the floating electrode from the surface of the insulating film, wherein
    the guard ring is provided so as to surround the via, and
    the via exposed from the surface of the insulating film is irradiated with the electron beam to inject electrons into the floating electrode.

14. The manufacturing method according to claim 7, further comprising:
    forming a through-hole that penetrates to the floating electrode from the surface of the insulating film, wherein
    the guard ring is provided so as to surround the through-hole, and
    the floating electrode is irradiated with the electron beam through the through-hole.

15. The manufacturing method according to claim 7, further comprising:
    forming a package section to enclose the memory device after electrons are injected in the floating electrode.

16. The manufacturing method according to claim 15 wherein
    the memory device is fabricated by depositing prescribed materials in layers on a semiconductor substrate, and
    the package section is formed in a top layer on the semiconductor substrate.

17. The manufacturing method according to claim 7, wherein identification information of the memory device is written by irradiating the floating electrode with the electron beam.

18. A data writing method to write data to a memory device which stores the data by retaining charges in a floating electrode that corresponds to the data to be stored, comprising:
    when a data value to be newly written corresponds to a charge amount that is larger than a charge amount accumulated in the floating electrode, irradiating the floating electrode with an electron beam according to a difference between a data value that is stored in the floating electrode and the data value to be newly written, and
    when a data value to be newly written corresponds to a charge amount that is smaller than a charge amount accumulated in the floating electrode, irradiating the floating electrode with ultraviolet to discharge charges accumulated in the floating electrode and then irradiating the floating electrode with an electron beam according to the data value to be newly written.

19. The memory device according to claim 1, wherein the guard ring is annular.

20. The memory device according to claim 1, wherein the guard ring is made of an electrically conductive metal material.

21. The manufacturing method according to claim 7, wherein the guard ring is annular.

* * * * *